(12) United States Patent
Huang et al.

(10) Patent No.: US 9,871,759 B2
(45) Date of Patent: Jan. 16, 2018

(54) SOCIAL NETWORK SERVICE FOR SEMICONDUCTOR MANUFACTURING EQUIPMENT AND USERS

(71) Applicant: Lam Research Corporation, Fremont, CA (US)

(72) Inventors: Chung Ho Huang, Fremont, CA (US); Henry T. Chan, Fremont, CA (US); Chad R. Weetman, Fremont, CA (US); David J. Hemker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 308 days.

(21) Appl. No.: 14/851,873

(22) Filed: Sep. 11, 2015

(65) Prior Publication Data

US 2017/0078238 A1 Mar. 16, 2017

(51) Int. Cl.
| | |
|---|---|
| *G06F 11/30* | (2006.01) |
| *H04L 12/58* | (2006.01) |
| *G01M 99/00* | (2011.01) |
| *H01L 21/67* | (2006.01) |
| *H04L 29/06* | (2006.01) |
| *G21C 17/00* | (2006.01) |

(52) U.S. Cl.
CPC ............. *H04L 51/32* (2013.01); *G01M 99/00* (2013.01); *H01L 21/67276* (2013.01); *H04L 51/046* (2013.01); *H04L 65/403* (2013.01)

(58) Field of Classification Search
CPC ..................................................... H04L 51/32
See application file for complete search history.

(56) References Cited

U.S. PATENT DOCUMENTS

| | | | |
|---|---|---|---|
| 7,398,164 B2* | 7/2008 | Ogushi | G06Q 10/0875 700/105 |
| 2015/0279172 A1* | 10/2015 | Hyde | G06Q 10/10 340/815.4 |

* cited by examiner

*Primary Examiner* — Phuong Huynh
(74) *Attorney, Agent, or Firm* — Martine Penilla Group, LLP

(57) ABSTRACT

Methods and systems for sharing information related to operational metrics of a plurality of equipment used in manufacturing of semiconductor wafer includes interfacing a server with the equipment to allow the server to receive a plurality of parameters including operational metrics associated with operation of each of the plurality of equipment. The plurality of parameters are processed to identify event-related data, message-related data and to generate human-readable interpretation for the identified event-related data and the message related data. Users are identified for receiving the operational metrics of each of the plurality of equipment. The event-related data, message-related data and the corresponding human-readable interpretation for the operational metrics associated with each of the equipment are forwarded to a social network service for performing a posting operation to social data streams associated with the identified users. The operational metrics received over time from each of the equipment are managed so as to provide timely updates to the respective users on the status of each equipment. The timely updates are provided as additional postings to the respective social data streams of the users.

17 Claims, 9 Drawing Sheets

SOCIAL NETWORK SERVICE FOR SEMICONDUCTOR MANUFACTURING EQUIPMENT AND USERS

BACKGROUND

1. Field of the Invention

The present embodiments relate to manufacturing of semiconductor wafer and more particularly to social sharing of information generated by semiconductor equipment during operation of manufacturing processes.

2. Description of the Related Art

A semiconductor wafer undergoes various process operations, such as deposition, etching, cleaning, drying, etc., to generate a semiconductor device, such as an integrated circuit (IC) chip. To ensure a quality product, the various process operations and operational conditions within the various semiconductor manufacturing equipment used in the process, are monitored. Current means of monitoring and tracking the processes and operational conditions within the various semiconductor manufacturing equipment include receiving operational parameters from various sensors distributed in the equipment, rendering the operational parameters in raw machine format, and using the operational parameters to manually generate static graphs, tabular reports, etc., related to the operation of the equipment. Deciphering the raw machine data and/or generating the graphs and reports involve significant investment in time and effort, as a user has to interpret the operational parameters received from different manufacturing equipment, analyze the interpreted operational parameters, consolidate, and configure the data provided in the operational parameters to a format, such as graphs, reports, etc., that others users can comprehend. The generated graphs and reports are then distributed to appropriate users to keep the users informed. The current means do not facilitate user-user information sharing as they isolate users from one another.

It is in this context that embodiments of the invention arise.

SUMMARY

Embodiments of the disclosure define systems and methods operated on a server that is configured to be interconnected with a plurality of equipment used for manufacturing semiconductor wafers. An application executing on the server is configured to receive process parameters from equipment used in the manufacturing process. These process parameters provide process status updates related to operation of the equipment during the manufacturing process. The application executing on the server includes interpreter logic to interpret the process parameters that are provided in raw machine format into human-readable format. The human-readable interpretation of the process parameters are provided to a social network service (SNS) that is interfaced with the application to allow sharing of information related to the process parameters in social data streams of one or more users. The users are identified based on the users' attributes, users' interactions in relation to the equipment, users' usage of the SNS, or operation of the equipment. Process status updates are received from the equipment over time, during the operation of the equipment, which are interpreted into human-readable format and updated to respective social data streams of the users in substantial real-time as additional postings.

When the users connect to the SNS, the SNS provides the related social data stream for the users that include postings of process status updates generated by the equipment during its operation. The postings could be presented in a format defined by or for the user. Information provided in the postings may be used by the users to interact with other users, to match the process parameters of a first equipment with a second equipment to obtain comparable process results, or as feed forward information to adjust process inputs for a second equipment used in a subsequent process operation.

In one embodiment a method is disclosed. The method is operated on a server that is configured to be interfaced with a plurality of equipment used for manufacturing semiconductor wafers. The interfacing allows receiving a plurality of parameters that are associated with operation of each of the plurality of equipment. The plurality of parameters includes operational metrics generated at each of the plurality of equipment during processing of the semiconductor wafers. During operation, an interpreter module executing on the server is configured to receive the plurality of parameters from each of the equipment over time and process the operational metrics included within to identify event-related data, message-related data and to generate human-readable interpretation for the identified event-related data and the message related data. Users are identified for receiving the operational metrics concerning the operation of each of the plurality of equipment. The event-related data, message-related data and the corresponding human-readable interpretation are forwarded to a social network service for performing a posting operation to social data streams associated with the identified users. The operational metrics received over time from each of the equipment are managed so as to provide timely updates to the respective users on the status of each equipment. The timely updates are provided as additional postings to the respective social data streams of the users.

In an alternate embodiment, a method is disclosed. The method is operated on a server that is configured to be interconnected with a plurality of equipment used for manufacturing semiconductor wafers. The method includes interfacing each of the plurality of equipment with the server. The interfacing is configured to allow receiving, at the server, a plurality of parameters that are associated with operation of each of the plurality of equipment. The plurality of parameters includes operational metrics generated at the plurality of equipment during processing of the semiconductor wafers. An interpreter module executing on the server is configured to receive the plurality of parameters from a first equipment, process the plurality of parameters to identify event-related data and message-related data contained within, and to generate human-readable interpretation for the event-related and message-related data of the first equipment. Users are identified for receiving the human-readable interpretation for the operational metrics generated by the first equipment. A posting operation is performed to social data streams associated with the identified users, wherein the posting includes the human-readable interpretation of the operational metrics of the first equipment. Information provided in the posting is used to identify and adjust one or more process inputs for a second equipment, wherein the second equipment is used to perform a subsequent process operation on the semiconductor wafers. The adjustment of the process inputs at the second equipment is used for optimal processing of the semiconductor wafers at the second equipment.

In another embodiment, a system is disclosed. The system includes a server that is configured to be interconnected with a plurality of equipment that are used for manufacturing semiconductor wafers. The server includes an interface to communicatively connect each of the plurality of equipment with the server. The interface is configured to allow receiving, at the server, a plurality of parameters that are associated with operation of each of the plurality of equipment. The plurality of parameters includes operational metrics generated at the respective equipment during processing of the semiconductor wafers. An interpreter module executing on the server is configured to receive and process the plurality of parameters to identify event-related data or message-related data and to provide human-readable interpretation for the operational metrics generated at each of the plurality of equipment over time. The interpreter module includes a semantic identifier logic that is configured to examine at least a portion of the plurality of parameters of each equipment to identify event-related data, message-related data contained within and to identify the human-readable interpretation of the event-related, message-related data. The interpreter module also includes a message-assembly logic to assemble the event-related data, message-related data, and corresponding human-readable interpretation for each equipment into post data. A social network service is coupled to the interpreter module. The coupling allows the interpreter module to forward the post data to the social network service. The social network service is configured to perform a posting operation of the post data to social data streams associated with specific ones of users that are authorized to receive the post data that includes the operational metrics of each equipment.

In yet another embodiment, a method is disclosed. The method is operated on a server that is configured to be interfaced with a plurality of equipment used in a manufacturing process. The interfacing allows receiving a plurality of parameters that are associated with operation of each of the plurality of equipment. The plurality of parameters includes operational metrics generated at each of the plurality of equipment during the manufacturing process. During operation, an interpreter module executing on the server is configured to receive the plurality of parameters from each of the equipment over time and process the operational metrics included within to identify event-related data, message-related data and to generate human-readable interpretation for the identified event-related data and the message related data. Users are identified for receiving the operational metrics concerning the operation of each of the plurality of equipment. The event-related data, message-related data and the corresponding human-readable interpretation are forwarded to a social network service for performing a posting operation to social data streams associated with the identified users. The operational metrics received over time from each of the equipment are managed so as to provide timely updates to the respective users on the status of each equipment. The timely updates are provided as additional postings to the respective social data streams of the users.

As will be appreciated by those skilled in the art, one aspect of the disclosure is that certain postings made to the social network service (SNS) are being initiated by equipment tools, instead of only enabling users to post. The postings made by the equipment include status information, condition information, progress information, alerts, statistics, and other metrics. This data is considered raw data that is generated by the equipment. This raw data is then read by the server and processed to generate human readable interpretation. The human readable interpretation that is generated can include message data that can be included in a post, alert data related to trigger events that can be added to a post, or simply alerts related to trigger events. An aspect of the disclosure, therefore, is enabling equipment to provide data that will be used to generate posts to the SNS. In some cases, the raw data can be formatted or reconstructed into sentences or statements that are more understandable to a human reader accessing the SNS. In other cases, certain raw data can be posted along with the message, e.g., such as data that does not need interpretation. For example purposes, certain data, such as numeric data, may not need transformation to human readable form, as that data is already human readable. The SNS can therefore provide an easy to understand snapshot of operation statistics of specific equipment, provided the user has privileges to access the specific tools. Further yet, the SNS can be customized for users, such that users can access different types of historical data or metrics, generate reports, view graphs of operation, see comments from other users related to alerts, faults or progress, and further provide comments in response to certain postings or comments by others.

Other aspects of the disclosure will become apparent from the following detailed description, taken in conjunction with the accompanying drawings, illustrating by way of example the principles of the disclosure.

BRIEF DESCRIPTION OF THE DRAWINGS

The disclosure may best be understood by reference to the following description taken in conjunction with the accompanying drawings.

DESCRIPTION

Figure 1:
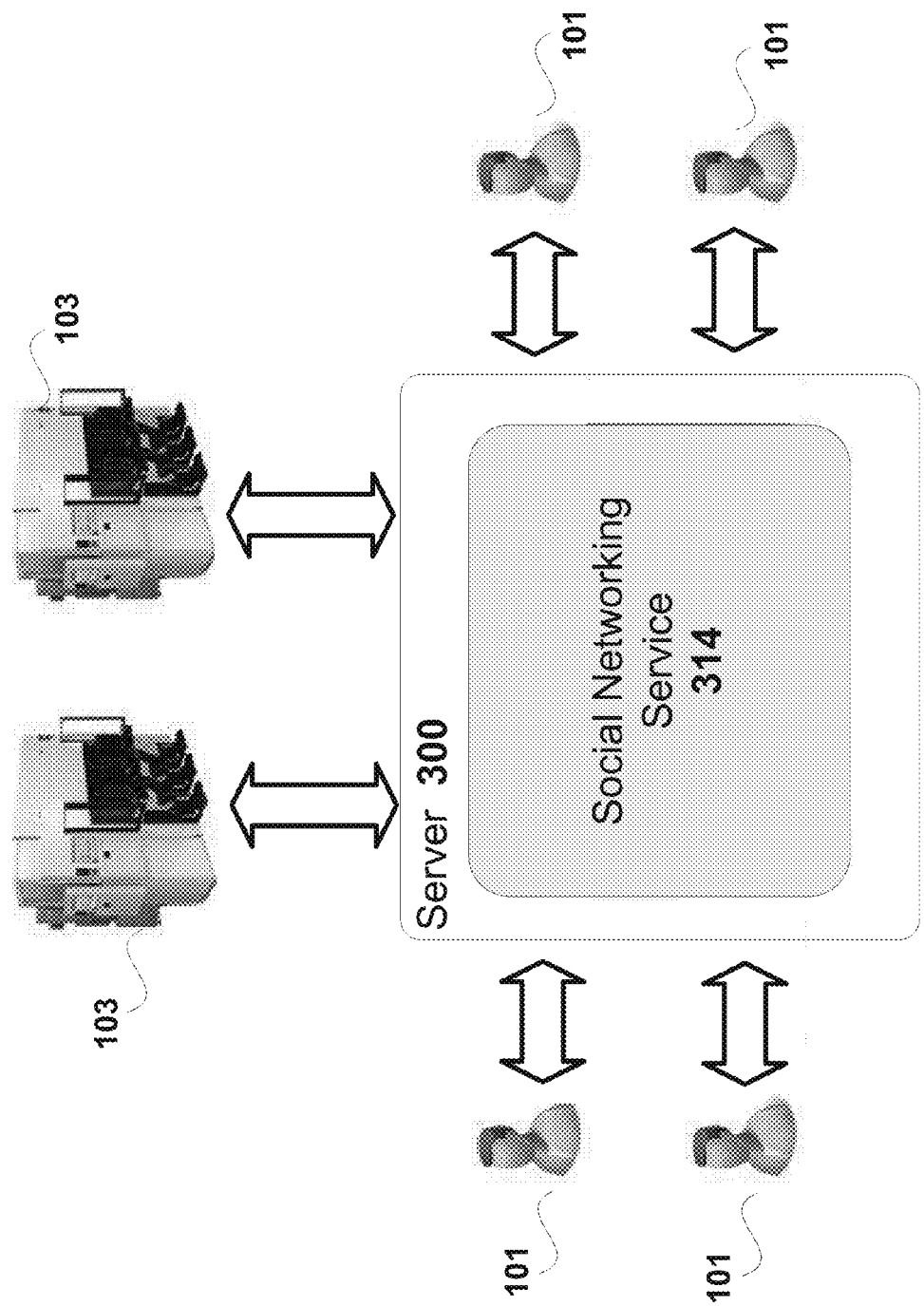
FIG. 1 illustrates a simplified block diagram of flow of information generated at a plurality of equipment used in the manufacturing of semiconductor wafers, in one embodiment of the disclosure.

Embodiments of the disclosure define systems and methods for receiving and sharing information related to operation of semiconductor manufacturing equipment. The systems allow receiving process status updates from one or more semiconductor manufacturing equipment used in semiconductor manufacturing operation at a server, processing and presenting these equipment generated updates in social data streams of users interested in receiving these updates from such equipment. The updates received during operation of equipment are provided to the users. In one embodiment, users are identified based on their expressed interest, interactions related to the equipment, user attributes, such as title, responsibility, level, member of an organization, member of a group, expertise, etc., or based on equipment operation. In general, privilege settings can be set based on a user basis or based on specific equipment. In some embodiments, user groups can be created and users can be dynamically assigned access privileges to specific tools or groups of tools.

In one embodiment, social data streams provide a user interface through which the users may interact with one another, post information related to specific equipment or fabrication operation to be shared with other interested users, receive notifications when the process updates identify a trigger event, successful completion of process, etc. The systems facilitate collaborative information sharing related to equipment(s) of interest to the users.

Further, the systems allow users to identify other equipment that are used in similar operations so as to leverage operational metrics data sharing between such equipment in order to obtain optimal process results. For example, data sharing can be used to calibrate by matching process inputs of a first equipment with a second equipment to obtain comparable and/or consistent process results. In another example, the operational metrics from a first equipment may be used as feed forward information to adjust process inputs of a second equipment that is used to perform a subsequent operation on a semiconductor wafer so as to obtain optimal results from the manufacturing operations performed by the second equipment.

The social data streams generated by a social network service for sharing information may operate in a manner similar to other social media streams generated by other social media applications, in that a user interface provided at the social media streams include options that allow users to interact with one another. However, the social data streams of the current embodiments differ from other social data streams in that each of the plurality of equipment used in the semiconductor wafer manufacturing process is a member of the social network alongside the users and is configured to provide process status updates that are presented as postings in the social data stream.

Each of the plurality of equipment, during operation, provides a plurality of parameters in the form of raw, machine-data. An interpreter module is used to process the raw, machine-data of the parameters to identify event-related data, machine-related data contained within and to generate a message that includes human-readable interpretation of the machine-data. The human-readable interpretation is provided as posts within the social data streams of the users associated with the equipment, thereby enabling an equipment-user interaction. User interaction to the postings is enabled thereby allowing an user-user interaction. The systems and methods thereby allow both machine-user and user-user communication.

The information provided in the social data streams could be used to learn a user's behavior toward process status updates provided by different equipment used in the manufacturing process of semiconductor wafers, and use this information to bring relevant information to the user's notice. For example, the information could be used to make suggestions to a user with regards to lots, recipes or equipment that the user may be interested in based on the user's interest in related lots, recipes or equipment. In another example, the system may make suggestions to a user based on interactions of other users that share similar user attributes. In some embodiments, the system could streamline posting to the social data stream of the respective users by emphasizing or de-emphasizing certain ones of the status update posts, based on the interactions of the user to similar prior posts. For example, the user may have interacted more with status update posts from a first equipment and less with status update posts of a second equipment. In this example, the posts related to the first equipment's status updates are emphasized more in the social data stream of the user by prioritizing these posts higher than the posts related to the second equipment. The status update posts originating from the equipment and shared in social data streams can be successfully used for process operation optimization.

FIG. 1 illustrates a simplified block diagram showing an overview of flow of information originating from the equipment, in one embodiment of the disclosure. A plurality of equipment 103 are interfaced with a server 300 and provide the process parameters to the server 300, during operation. The equipment 103 that are interfaced with the server 300 are used during the manufacturing of semiconductor wafers, for example. The process parameters that include the operational metrics are provided in a raw, machine-data format. An interpreter module (not shown) executing on the server 300 together with a social network service (SNS) 314 interprets the raw, machine-data provided in the process parameters to generate human-readable interpretation. The SNS 314 provides the human-readable interpretation as posts in social data streams for users 101 that are associated with the respective equipment. Users 101 may view process status update information provided in the posts, request similar information for other equipment, interact with other users to share information related to the posts and/or provide information to influence process inputs of one or more equipment so as to address any issues raised in the posts in order to obtain optimal process results.

Figure 2:
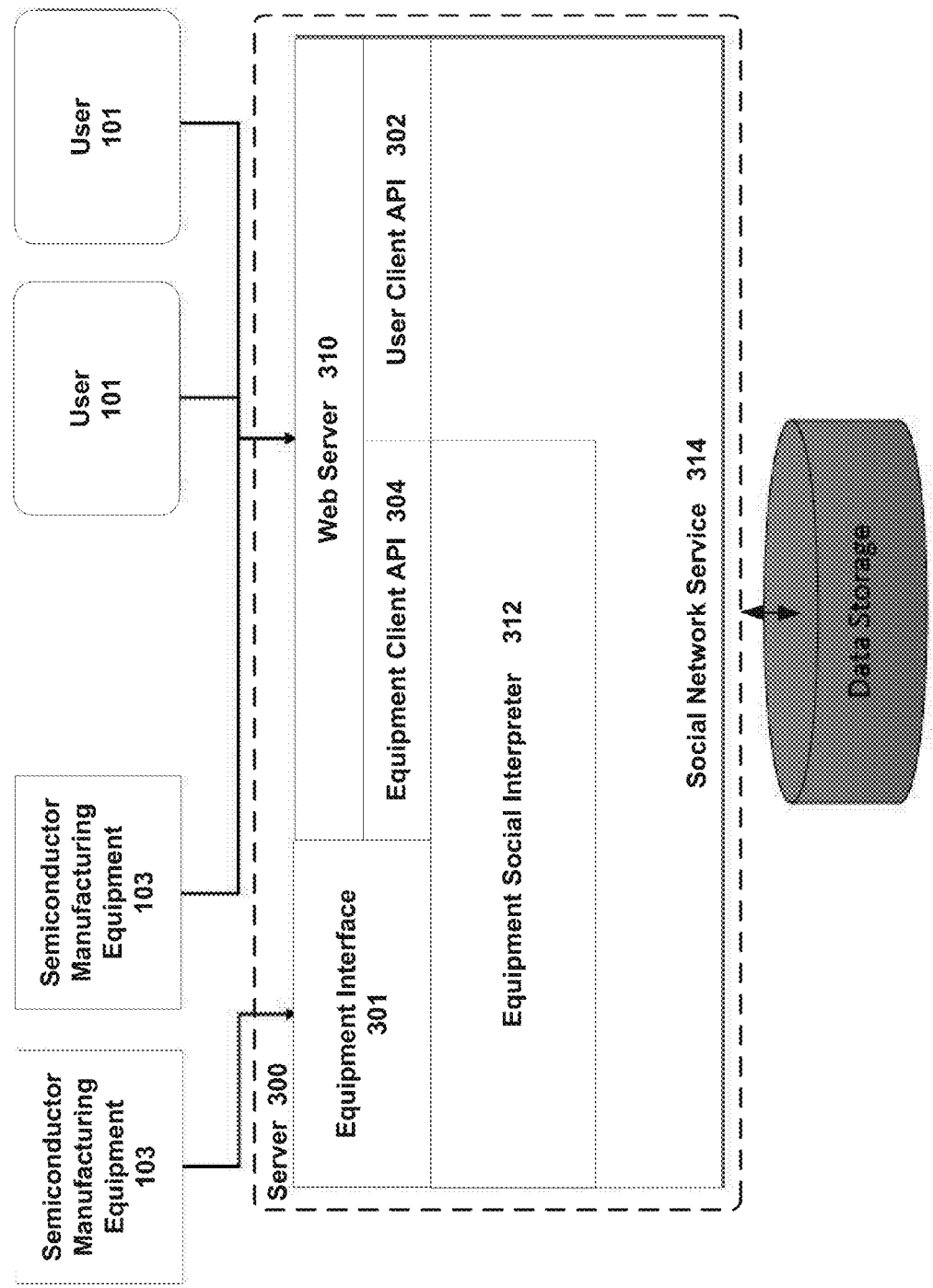
FIG. 2 illustrates a simplified block diagram of an example system architecture used to share information related to operational metrics generated by a plurality of equipment during manufacturing operation, in one embodiment of the disclosure.

FIG. 2 illustrates a simple block diagram of an example system architecture used for sharing information generated by one or more equipment used in a manufacturing process of a semiconductor wafer. The system includes a server 300 that is interconnected with a plurality of equipment 103 that are used in the manufacturing process of a semiconductor wafer. The interconnection may be through a communication interface, such as an equipment interface 301, or through an interface, such as a web server 310. The equipment 103 may be connected to the equipment interface 301 through a wired or wireless connection. In some embodiments, the equipment interface 301 may use a semiconductor equipment interface protocol, such as SECS/GEM (SEMI Equipment Communications Standard/Generic Equipment Model), a protocol developed by Semiconductor Equipment and Materials International (SEMI), Equipment Data Acquisition (EDA) protocol, such as Interface A protocol, etc., to allow the equipment 103 to communicate with an application, such as an equipment social interpreter application 312, hosted by the server 300. In the embodiment where the interconnection is through the web server 310, the equipment 103 may communicate with the equipment social interpreter application 312 through an equipment client application programming interface (API) 304. The equipment client API 304 may be a generic or a proprietary API. The equipment interface 301 and/or web server 310/equipment client API 304 define a communication interface that allows the process parameters generated by the equipment 103, during process operation, to be transmitted to the equipment social interpreter application 312.

In some embodiments, one or more of the equipment 103 used in the manufacturing process of a semiconductor wafer may optionally be interfaced with a control software application (not shown), which in turn is interfaced with the server 300 through the communication interface. The control software application may be designed to receive process parameters from the interfaced equipment during process operation and forward the same to the equipment social interpreter application 312 on the server 300. In some embodiments, the process parameters may be obtained through one or more sensors, detectors, etc., (not shown) that are disposed in, on or near the equipment 103. In some embodiments where the control software is present, the control software may perform some processing before forwarding the process parameters over a network (not shown) and through the communication interface to the equipment social interpreter application 312 on the server 300. For example, as part of the processing, the control software may identify and include tags with the process parameters, wherein the tags may be used to identify the equipment that generated the process parameters.

The equipment social interpreter application 312 is configured to receive the process parameters from the plurality of equipment 103 through the communication interface and process the process parameters to identify operational metrics generated during semiconductor wafers processing. The processing may include identifying event-related data and/or message-related data that correspond to process status at the equipment. The equipment social interpreter application 312 identifies human-readable interpretation for the message-related data and/or the event-related data identified in the process parameters and generate post data for forwarding to a social network service 314. Further, as part of the processing, the equipment social interpreter application 312 may provide tags to be included in the post data. The tags associated with the post data may be used to identify the equipment that generated the process parameters associated with the post data, user to which the post data is directed, event-related information, severity level for any event-related data contained within the post data, notification type, etc.

The social network service (SNS) 314 may store the post data provided by the equipment social interpreter application 312 in a data store 320. In some embodiments, the SNS 314 may store the post data associated with each equipment separately. In alternate embodiments, the SNS 314 may store the post data directed for each user separately. In other embodiments, the SNS 314 may store the post in accordance to the equipment and the targeted user or in accordance to priority level for event-related data.

When a user 101 is interested in receiving process status updates for an equipment, the user accesses the SNS 314 to request the information. In some embodiment, the user 101 accesses the SNS 314 through the web server 310 and a user client API 302. The user client API 302 may use any standard, proprietary or non-proprietary protocol to allow the user to communicate with the SNS 314. In response to receiving a request from a user 101, the SNS 314 may authenticate the user 101. Upon successful user authentication, the SNS 314 may query and receive the relevant post data for the user 101 from the data store 320, which is then posted in a social data stream for the user 101.

The postings in the social data stream may be presented in a format in accordance to the preference specified by the user or in accordance to information provided in the tags of each posting. Information provided in the social data stream for the user 101 includes information related to the operational metrics generated by the one or more equipment during manufacturing process. It is to be noted that the social data stream for the user 101 may include post data related to more than one equipment. When more than one equipment data is included, the post data related to different equipment may be presented in accordance to the user's interest, preference, priority level associated with the posting, operation of the equipment, etc., by elevating or emphasizing postings from certain ones of the equipment and de-emphasizing postings from other equipment. The information provided in the post data within the social data stream may be used by the users to share information with other users, request or provide assistance for any trigger event that resulted in failures or errors in certain ones of the equipment, adjust one or more process inputs for the equipment identified in the posting or for other equipment to obtain optimal processing results for better yield.

Figure 3:
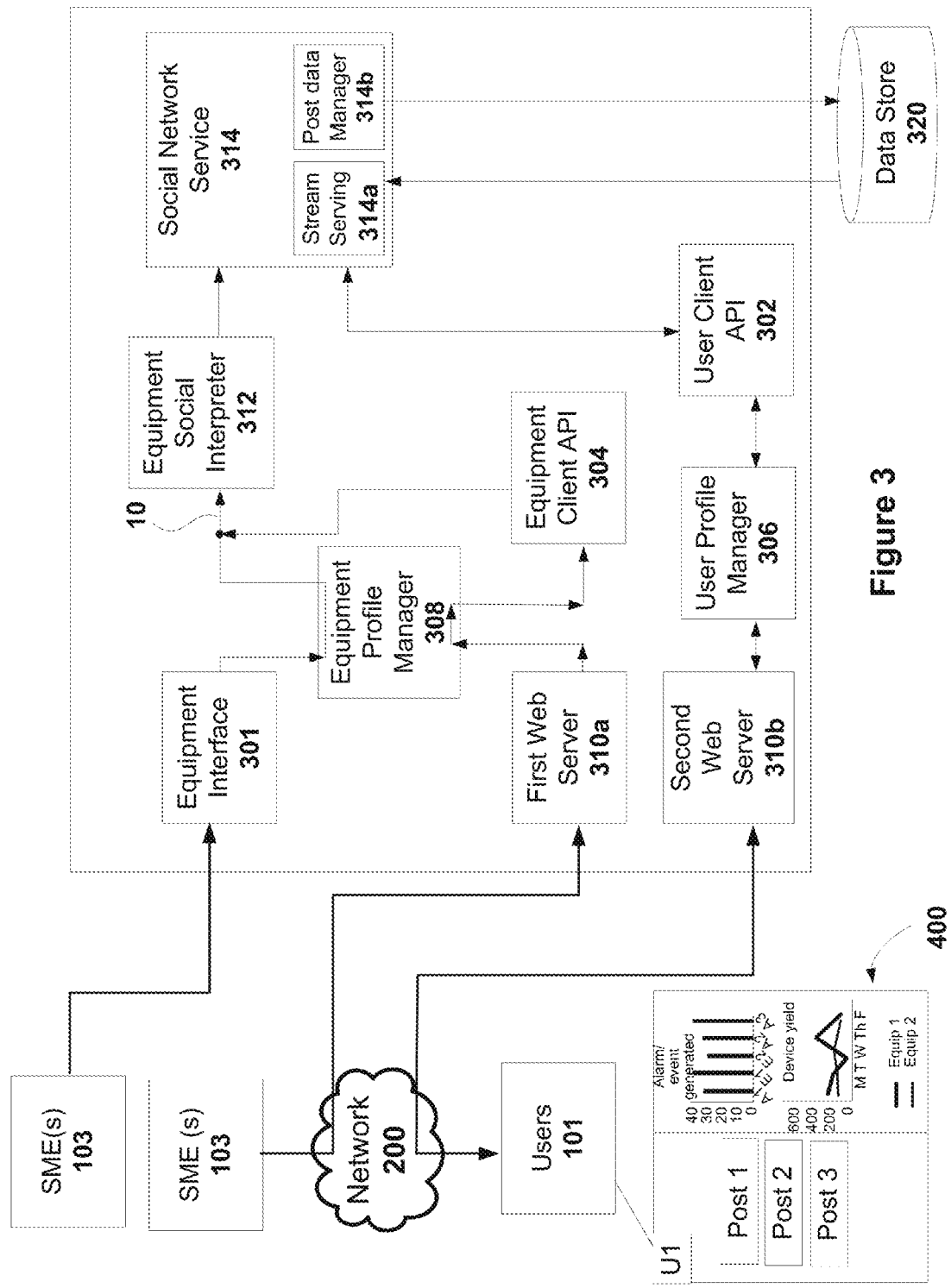
FIG. 3 is a simplified block diagram illustrating flow of data pertaining to operational metrics generated by a plurality of equipment, through various modules of the example system architecture illustrated in FIG. 2, in one embodiment of the disclosure.

FIG. 3 illustrates a simplified block diagram of an example system architecture identifying various modules used to generate post data for the process parameters generated by different equipment, for presenting to users, in one embodiment of the disclosure. The system includes a server 300 that is interconnected with a plurality of equipment 103 that are used in manufacturing semiconductor wafers. The interconnection may be through a wired or a wireless equipment interface 301 or may be through a first web server 310a and an equipment client API 304. The equipment 103 may connect to the first web server 310a of the server 300 over a network 200, such as the Internet, intranet, virtual private network, a local area network, a wide area network, a wireless local area network, etc. The equipment interface 301, the first web server 310a and the equipment client API 304 are henceforth referred to as communication interface.

During a semiconductor wafer manufacturing process, the equipment 103 may provide process parameters. The process parameters identify the various metrics observed during operation of the equipment. For example, the operational metrics may include temperature, pressure, power supplied, chemistry used, current generated, plasma density, etc., observed at various stages of the manufacturing process. In some embodiment, the process parameters may be obtained through sensors, detectors, etc., disposed in, on or near the equipment 103. The process parameters are forwarded to the server 300 through the communication interface for further processing. An equipment profile manager 308 receives the process parameters and performs a validation operation. For example, as part of the validation, the equipment profile manager 308 may verify to see if the process parameters are from a valid and active equipment source interfaced with the server. Upon successfully validating the equipment source, the equipment profile manager 308 may verify to see if the process parameters received are selected for sharing and if so, determine users or user groups to share the process parameters. The users are identified based on their interest, expertise, access specification defined for the equipment, etc. In some embodiments, the access specification may be provided in the form of an access control list maintained for each equipment that is used in the manufacturing process.

The equipment profile manager 308, upon successful verification may forward the process parameters along with user information to an equipment social interpreter application 312 for further processing. In some embodiments where the process parameters are received through the first web server 310a, the equipment profile manager 308 may forward the verified process parameters and the user information to the equipment social interpreter application 312 through an equipment client API 304 as data 10. In some other embodiments, the process parameters may be received through the first web server 310a and the equipment client API 304. In such embodiments, the equipment profile manager 308 may forward the verified process parameters and the user information directly to the equipment social interpreter application 312 as data 10. In other embodiments where the process parameters are received through the equipment interface 301, the equipment profile manager 308 may forward the verified process parameters and corresponding user information directly to the equipment social interpreter application 312 as data 10.

The equipment social interpreter application 312 examines data 10 provided by the equipment profile manager 308 to identify event-related data or message-related data contained within and processes both to generate human-readable interpretation. The workings of the equipment social interpreter application 312 will be explained in more detail with reference to FIG. 4. The processed event-related data, message-related data and the corresponding human-readable interpretation are forwarded to a social network service (SNS) 314 for presenting to one or more users.

The SNS 314 receives the processed data and engages a post data manager 314b to store the processed data as post data in a data store 320. The post data manager 314b may store the processed data for each equipment separately, for each user separately or may store generically in a temporal order with the tags identifying the equipment and the users.

A user 101 interested in receiving the processed data for one or more equipment used in the manufacturing of semiconductor wafers, generates a request using a client device (not shown) associated with the user 101. The request is forwarded to the SNS 314 over the network 200 and through a second web server 310b. In some embodiments, the second web server 310b used for forwarding the request may be separate from the first web server 310a used by the equipment 103. In these embodiments, the first web server 310a may be specifically designed for receiving communication from the equipment and the second web server 310b may be specifically designed for providing the users with access to the SNS 314 to enable communication between the users 101 and the SNS 314. In other embodiments, the second web server 310b and the first web server 310a, although shown separately, may be part of web server 310 that allows the equipment 103 and the users 101 to access the server 300 and exchange information related to operation of the equipment 103.

The second web server 310b forwards the request from the user 101 to a user profile manager 306. The user profile manager 306 authenticates the user and identifies the one or more equipment 103 that are associated with the user 101. In some embodiment, user attributes may be used to validate the user 101 and to associate different equipment 103 so that information related to the operational metrics received from different equipment 103 may be directed appropriately. Some of the attributes used to associate the users to the equipment may include user's organization, user's ranking within the organization, user's expertise level, user's interest based on number and type of interaction detected at prior postings for the equipment, etc. For example, a user's attributes may identify a user 101 as an operator in a fabrication facility. In this case, the user 101 may be authorized to receive information related to operational metrics of specific ones of the equipment 103 that the user 101 is responsible for managing. A user 101 who is a manager in the fabrication facility may be authorized to receive process parameters of all the equipment 103 that are on a particular floor of the fabrication facility. In another example, a user 101 who is an expert in equipment 103 used to perform a particular operation may receive information related to the operational metrics of the equipment 103 that are used for performing the particular operation. The validated request is forwarded by the user profile manager 306 to SNS 314 through a user client API 302.

The SNS 314 receives the request from a user 101 and determines that the request is for process status update for one or more equipment that the user 101 is associated with and engages a stream serving module 314a to provide the necessary information. The stream serving module 314a uses the user attributes identified from the request and, in turn, sends a request to the data store 320 for requesting the post data for the equipment associated with the user 101. The stream serving module 314a receives the post data from the data store 320, formats the post data and provides the formatted post data to the user 101 in a social data stream 400. The formatting causes the post data to be presented in the social data stream of the user in accordance to any one or more of the user attributes, preferences expressed by the user, notification type defined in the post data, equipment status, trigger events, states, etc.

In some embodiments, the stream serving module 314a may aggregate information related to the operational metrics generated by one or more equipment 103 over a period of time and present the aggregated information to the users in a specific format. For example, the aggregated information may be used to determine equipment performance, process yield, number and type of alarms or other trigger events triggered, etc., associated with each equipment and may be presented as a plot graph, bar graph, summary, etc.

The social data stream provides options to allow users to interact with one another and to request process parameters of the other equipment that are similar to a particular equipment the user is authorized to receive, or related to the particular equipment. User interactions to the post data are also captured by the SNS 314 and provided as additional postings in the social data streams of other users that are allowed to or interested in receiving such information. Information provided through user interactions, for example, may be used to adjust process inputs to one or more equipment to influence process operation at the respective equipment.

Figure 4:
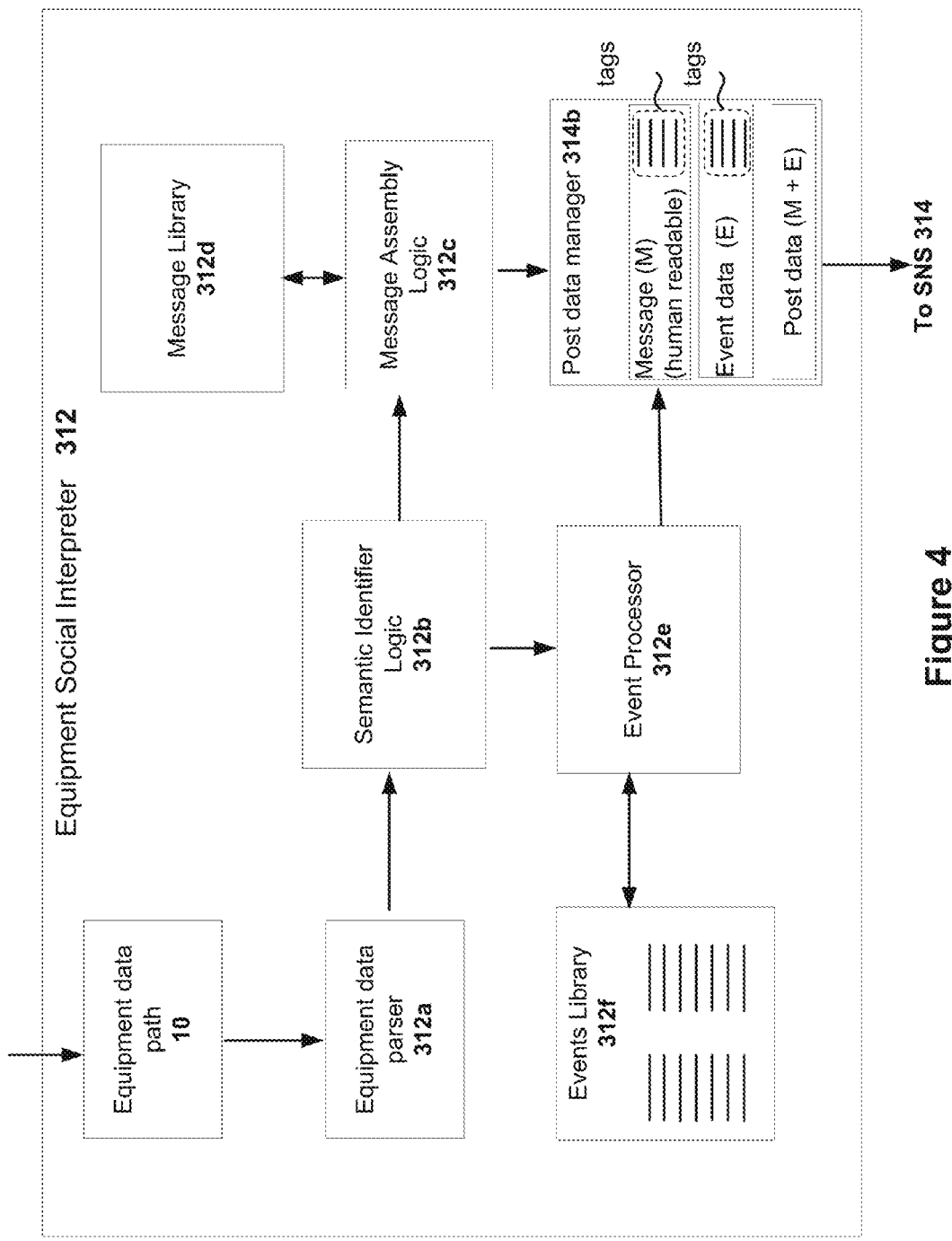
FIG. 4 illustrates a simplified block diagram of various modules within an interpreter module used in the example system architecture of FIGS. 2 and 3, in one embodiment of the disclosure.

FIG. 4 illustrates various modules within the equipment social interpreter application 312 that are used in processing the process parameters received from different equipment to enable sharing information related to the operation of the equipment with users that are interested in receiving such data. The equipment social interpreter application 312 includes an equipment data parser 312a that receives the data 10 provided by the equipment profile manager 308 of FIG. 3, and performs a first parse of the data to ensure that the data is valid data from a valid source. Upon verification, the equipment data parser 312a passes the parsed data to a semantic identifier logic 312b. The semantic identifier logic 312b obtains the parsed data and identifies one or more event-related data or message-related data contained within. The parsed data is in raw, machine-data format. As a result, the semantic identifier logic 312b may examine a portion of the parsed data (e.g., a string of bits, a chunk of bits, byte, etc.), to determine if data bits identified in the portion relate to a known pattern, such as a keyword, a phrase, a trigger event, a code, etc. In some embodiments, semantic identifier logic 312b may also identify the corresponding context of the examined portion of the parsed data. When the data bits contain a known pattern, the semantic identifier logic 312b will include an identifier for the known pattern.

When the examined data bits identify a trigger event, the semantic identifier logic 312b forwards the bits that identify the trigger event and the corresponding identifier to an event processor module 312e for further processing. The event processor module 312e may refer to an events library 312f to obtain information related to the trigger event. The events library 312f, in one embodiment, may store detailed information related to various predefined trigger events that are known or that may be encountered during operation of different equipment. The information related to the pre-defined trigger events maintained in the events library 312f may, for example, be obtained from a manufacturer of the equipment, datasheets related to the equipment, user manuals, provided by a user, or may be obtained from other sources. The events library 312f may include a mapping of the strings of the raw, machine data bits to corresponding pre-defined trigger events. In some embodiments, in addition to providing the mapping, the events library 312f may also include detailed information related to the pre-defined trigger events in human-readable format. The event processor module 312e queries the events library 312f, obtains the event-related information for the trigger event identified in the data bit string, and includes the event-related information with the data bit string to generate event-related post data. Along with the event-related information, the event processor module 312e may identify and include tags for the identified trigger event in the post data. The tags included in the post data may be used to identify the equipment associated with the examined data bit string, user(s) for presenting information related to the trigger event, trigger event identifier, severity level, notification type, etc.

In some embodiment the events library 312f may just include a mapping of the bit strings with pre-defined event identifier. In such embodiments, the event processor module 312e may forward the trigger event identifier and the data bit string to a message assembly logic 312c to identify human-readable interpretation of the trigger event. The function of the message assembly logic 312c will be explained in detail below.

When the examined data bits identify a pattern associated with a phrase, a code, a keyword, etc., related to a message, the semantic identifier logic 312b may forward the examined data bits and the corresponding identifier to the message assembly logic 312c for further processing. The message assembly logic 312c receives the data bits forwarded by the semantic identifier logic 312b and/or data bits with event identifier forwarded by the event processor module 312e, and uses a message library 312d to identify human-readable interpretation for the pattern of data bits or for the trigger event identifier. The message library 312d may include a mapping of human-readable interpretation for different strings of data bits that are generated by the equipment. The message assembly logic 312c retrieves the appropriate human-readable interpretation for the examined data bits from the message library 312d, assembles them into a coherent message and provides the assembled message as message-related post data or event-related post data, depending on which data bits is being processed by the message assembly logic 312c, to a post data manager 314b. In some embodiments, along with the assembled message, the examined data bits and the relevant tags may also be included in the event-related or message-related post data. As with the tags provided by the events library, the tags for the assembled message may identify the equipment, the user, notification type, etc.

The post data manager 314b assembles the human-readable interpretation of the message-related data ('M') and the event-related data ('E') along with the associated tags to generate post data. The post data manager 314b forwards the post data to the SNS 314 for further processing.

In some embodiment, when a trigger event is included in the examined data bits, the semantic identifier logic 312b may generate a notification for sending to the appropriate users. The notification, for example, may include a notification type, a severity level, etc., associated with the trigger event. The notification type may be defined based on the severity level of the trigger event. For example, when the trigger event identifies a severe error, the notification type may be a posting and the semantic identifier logic 312b may generate a notification posting with high priority level so that the SNS 314 may place the notification posting at the top of the social data streams of the appropriate users that are identified for receiving such notification. Alternately, the notification type may identify different forms of notification, such as an email notification, a message chat, a phone call, etc., or combinations of the different forms, that are directed to one or more devices or accounts associated with the one or more users identified for receiving such notification. In some implementations, when the notification is presented in a post, an email, a message chat, etc., the notification may include a link to the social data stream of the respective users. When a user selects the link, the social data stream of the user is generated with the latest postings for the equipment related to the user including a posting from the equipment that generated the data that identified the trigger event. The postings provided in the social data stream may include the event-related data and allow the user to interact with other users to exchange information related to the trigger event. When the notification is presented as a message chat, the social data stream may provide an interface to allow the users to chat, message, or otherwise interact with one another in relation to the operational metrics information provided in the notification.

The post data is forwarded to the SNS 314. The SNS 314 will store the post data in a data store 320 for subsequent processing. When a request from a user 101 is received at the SNS 314, the user request is first authenticated and upon successful authentication, the relevant post data for the user 101 are retrieved from the data store 320, formatted and presented to the user in a social data stream in accordance to at least the user's attributes and preferences. In some embodiments, the stream serving module 314a may format the post data information for a user based on a user's level, user's expertise, user's activity status, user's schedule, user's preferences, etc. For instance, each operator within the fabrication facility may be provided information related to the operational metrics of particular equipment that he is responsible for, in a detailed format to keep the operator updated with the process status of the particular equipment at different stages of the process operation that ended in successful or unsuccessful processing of semiconductor wafer.

A manager of the fabrication facility may receive a posting of all equipment that falls under the manager's responsibility. In the posting provided to the manager, the operational metrics of the different equipment may be consolidated and presented in a summary format, for example. In some embodiments, each entry in the consolidated posting may be expanded to allow the manager to obtain the detailed information of the equipment similar to what was provided to the fab operator, if needed.

The post data presented to the user may include post data related to more than one equipment. Interactions related to the post data provided in the social data streams are enabled from the user and other users and such interactions are updated to the respective users' social data streams and stored in the data store 320. The information (including post data and user interactions) provided in the social data stream can be used to match or adjust process inputs of similar equipment so as to obtain comparable results, trouble-shoot issues identified by the trigger event, or may be used as a feed forward information to adjust process inputs of a second equipment used for subsequent process operation.

Authentication of a user and verification of which user needs to be provided with information related to operational metrics of different equipment may be important, especially in a fabrication facility that may use proprietary or non-proprietary equipment from multiple vendors. Even when the assembly plant uses equipment from a single vendor, providing timely updates for particular equipment to appropriate users would result in faster and prompt response from the targeted users. For example, users who are experts or more familiar with the workings of a particular equipment would be able to detect potential issues even before they occur just by looking at the periodic process status updates provided in the operational metrics by the particular equipment. Such timely process status updates for an equipment may allow the user(s) to pro-actively provide solutions to avert issues from surfacing or provide prompt solutions.

In some embodiments, the post data provided in the social data stream of users using the operational metrics generated by the equipment and the corresponding user interactions may be used to learn user behavior, draw correlation between historical usage of equipment with future desired usage, draw correlation between process inputs to operational metrics of different equipment, troubleshoot issues encountered in an equipment, etc.

Figure 5A:
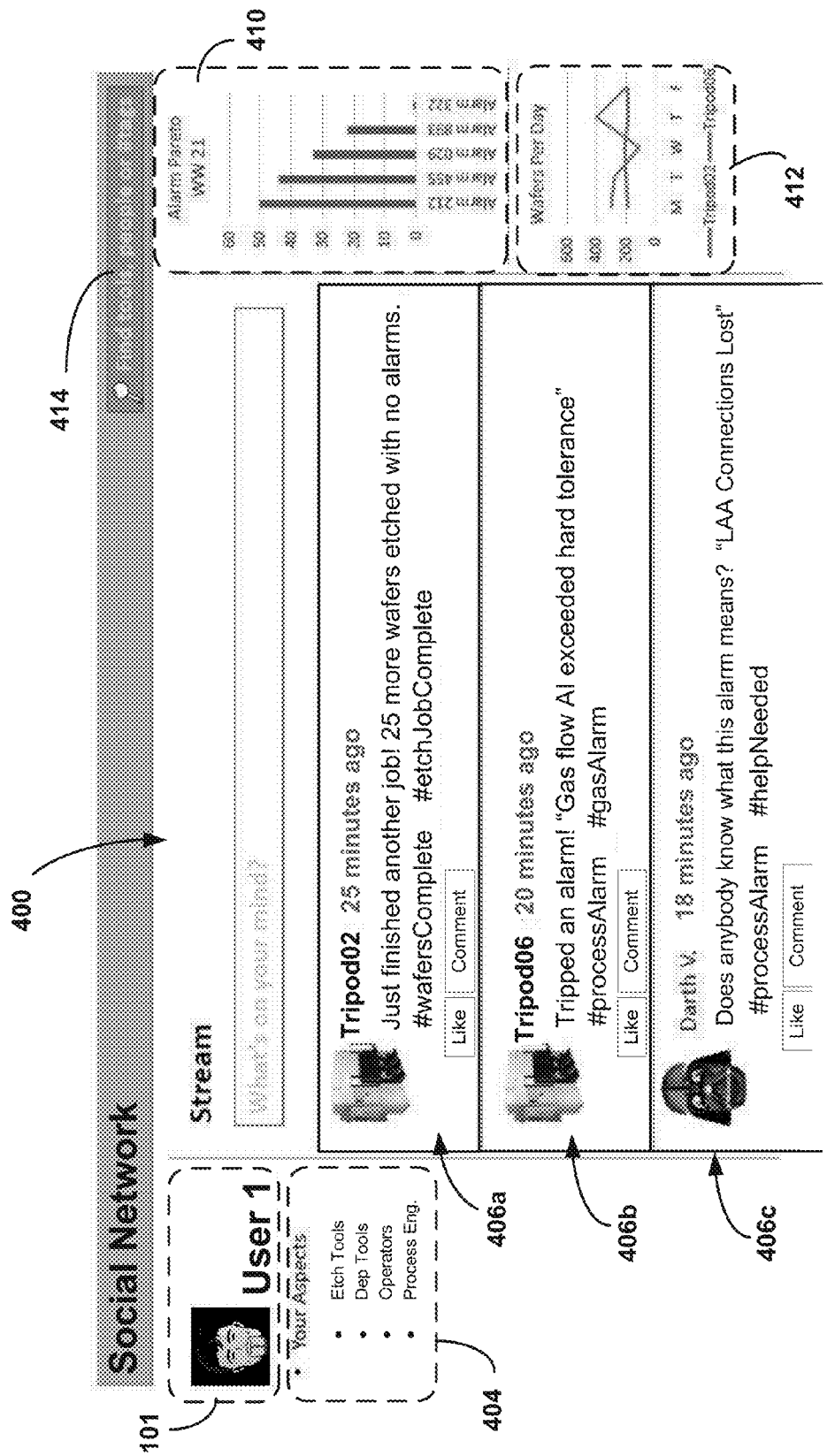
FIGS. 5A-5C illustrate example social data streams provided by a social network service with information related to semiconductor manufacturing equipment operation shared with a user, in one embodiment of the disclosure.

FIG. 5A illustrates an example social data stream 400 of a user 101 that is generated by the SNS 314, and includes post data information related to operational metrics generated at different equipment, in one embodiment. The social data stream 400 presented by the SNS 314 of FIGS. 3 and 4 is similar to a social data stream provided by a social network application except that some of the postings including the initial posting in the social data stream 400 relates to information related to operational metrics obtained from an equipment. The social data stream 400 includes user's 101 identification information that is obtained from the user's profile maintained at the SNS 314. The user's 101 identification information presented in the social data stream 400 may include a user's name, user's representative image, user's level in an organization, etc. In addition to the identification information, the user's 101 equipment preference may also be identified and presented alongside the user's 101 identification information. The user's equipment preference, in some embodiments, may be presented as a preference list 404. As mentioned earlier, the user's 101 equipment preference may be specified by the user, or may be based on the user's interactions, expertise level, user's organization, user's position in the organization, etc.

The social data stream 400 for user 101 includes an initial posting 406a that provides information related to operational metrics generated at equipment, Tripod02. Tripod02 may be one equipment 103 that the user 101 has shown interest in or is responsible for within a fabrication facility. The information presented is a human-readable interpretation of event-related data or message-related data related to the operational metrics received from the equipment. In addition to the posting, the social data stream includes options, such as "Like" option, "Comment" option, hash tags option, etc., for user interaction. The social data stream may also include a search option 414 to allow the user to search for information related to equipment, users, hash tags, etc. The social data stream 400 of the user 101, in some embodiment, may also include a posting 406b with information related to operational metrics of a second equipment, Tripod06. The Tripod06 equipment may have similar characteristics as the Tripod02 equipment that the user 101 has expressed interest in or it may be one of the equipment from the user 101's preference list 404. In one embodiment, the postings from different equipment and user interaction are presented in the social data stream 400 of user 101 in a temporal order (for example, from the oldest to the latest). In one embodiment, the information provided in the posting 406b may be related to a trigger event that is identified to be low in the severity level. As a result, the posting 406b continues to be presented in the temporal order followed for the user 101. In response to receiving the posting 406b, a second user 101, Darth V., may have responded with his posting 406c seeking information for resolving the underlying issue that caused the trigger event identified in posting 406b. The second user 101 may be another operator in the fabrication facility in which Tripod06 is operating, and may be authorized to receive the operational metrics of the second equipment, Tripod06. In response to the second user's posting 406c, other users including the first user 101 may interact through their own postings or by selecting the "Comment" option. The user interaction received from different users, in this embodiment, will be updated in the social data stream 400 of user 101 and used to influence process input of the second equipment to resolve the issue identified in the trigger event.

Figure 5B:
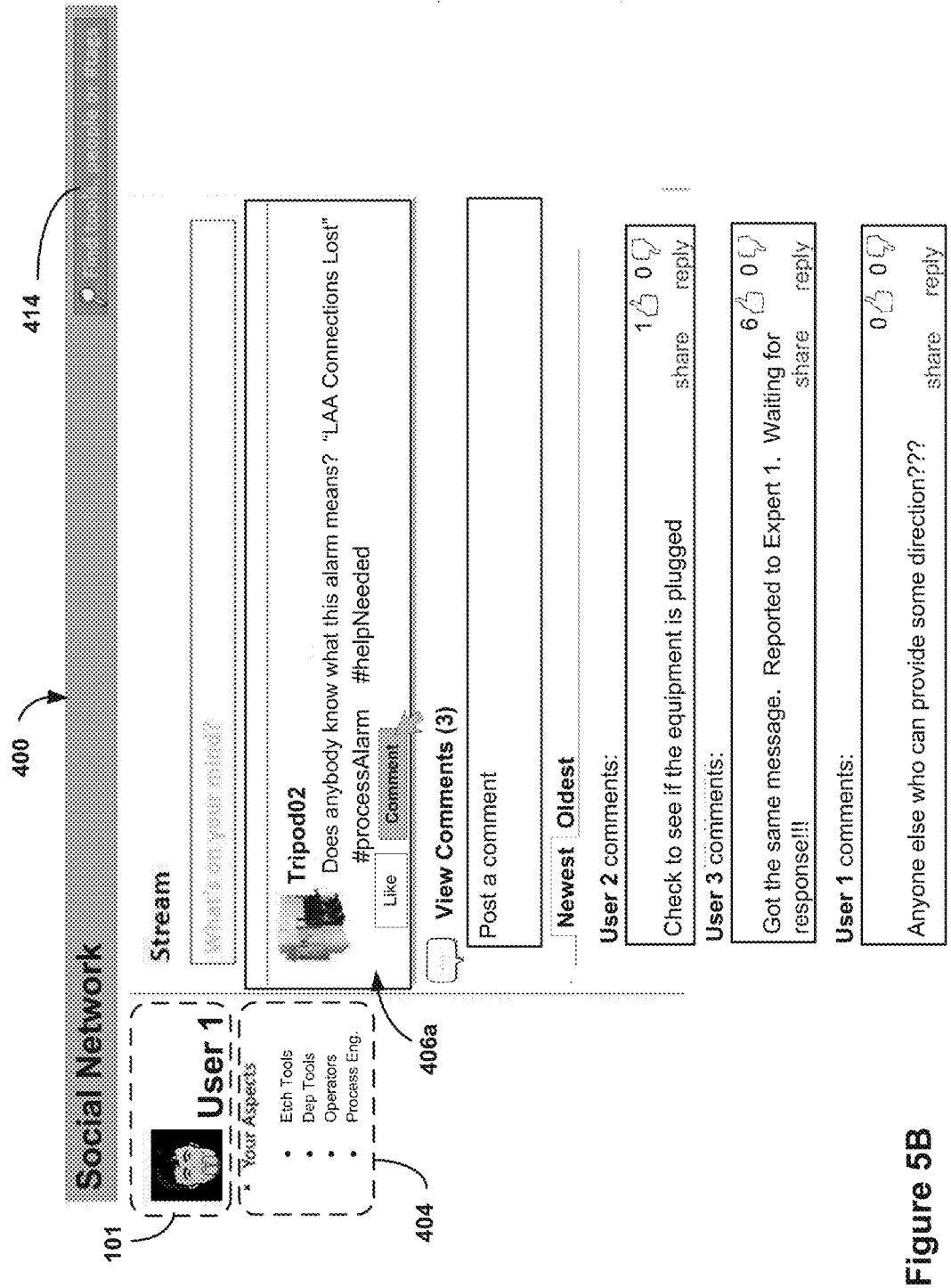

FIG. 5B illustrates an example social data stream 400 of the user 101 when the "Comment" option is selected. The comment option may be used to exchange information related to the posting for the operational metrics generated by an equipment, rate the posting, provide feedback ("Like" or "Dislike") for the posting, etc. The comments provided in the comment section are updated to other related users social data streams, in substantial real time, so that the other users can view, provide additional comment or, in some instances, use the information provided in the comment to adjust process inputs for the equipment related to the posting or for a different equipment.

Figure 5C:
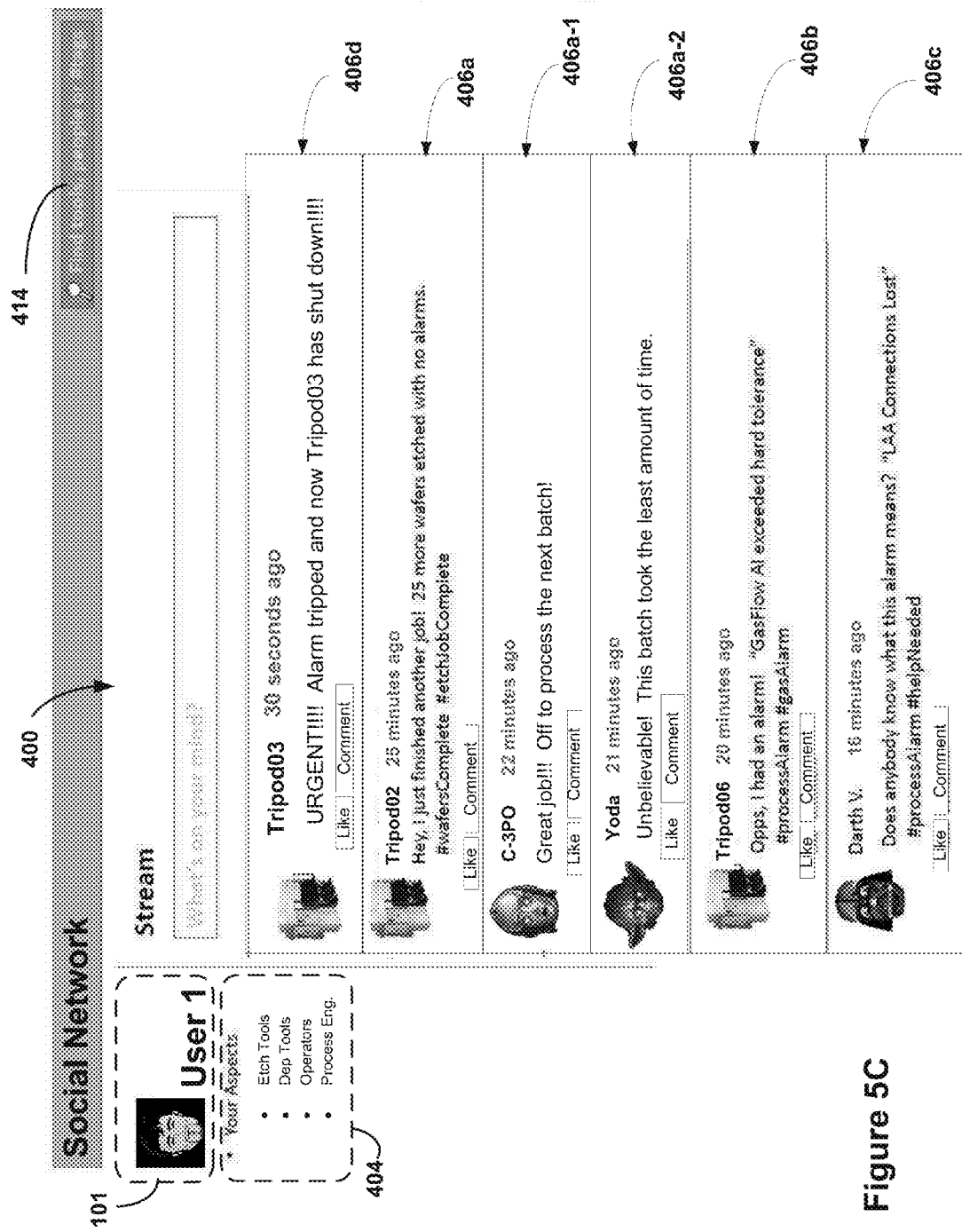

FIG. 5C illustrates an example social data stream 400 of a user 101 with additional postings being added to the social data stream, in one embodiment. The additional postings may be generated by other users in response to postings related to the operational metrics originating from one equipment, in response to interaction by other users, or by other equipment. For example, as illustrated in FIG. 5C, the additional posting 406a-1, 406a-2, are generated by other users 101 (C-3PO, Yoda) in response to the initial posting 406a related to the operational metrics originating from Tripod02. In addition to user interactions related to postings from equipment, Tripod02, additional postings related to operational metrics of Tripod03 equipment is also included in the user 101's social data stream 400. In one embodiment, the additional posting may identify a trigger event that may or may not require immediate attention. When a trigger event is identified, the additional posting may be presented in accordance to severity level associated with the trigger event. In the example social data stream 400 of user 101 illustrated in FIG. 5C, the additional posting from Tripod03 identifies a trigger event that has caused a severe error. As a result, the posting from Tripod03 is elevated to a higher position (i.e., top) in the social data stream 400 so as to draw the attention of the user 101. Alternately, when the trigger event is non-critical, the additional posting may be presented in the social data stream in an ascending or descending temporal order. FIG. 5C illustrates the postings from oldest to latest order except when a trigger event is detected at which time the posting with the trigger event is posted at the top of the social data stream 400.

The various embodiments discussed herein provide a social interaction application that allows the equipment to provide the process status updates during a manufacturing process in social data streams and the user to interact with one another to seek information and/or to share their knowledge in relation to the received process status updates. The format and options provided in the social data streams are familiar to the users and includes an interface where the novice and expert users can come together to exchange useful information with regards to effective operation of the equipment used in the semiconductor manufacturing process.

It should be noted that although various embodiments have been discussed herein in relation to a plurality of equipment that are used for manufacturing semiconductor wafers, the embodiments are not restricted to semiconductor manufacturing process but can be extended to include any manufacturing process. As a result, the plurality of parameters that are obtained from the equipment may relate to operational metrics generated at each of the plurality of equipment during a manufacturing process, and the users are provided details of the operational metrics generated at each equipment during the manufacturing process, in their respective social data stream.

Figure 6:
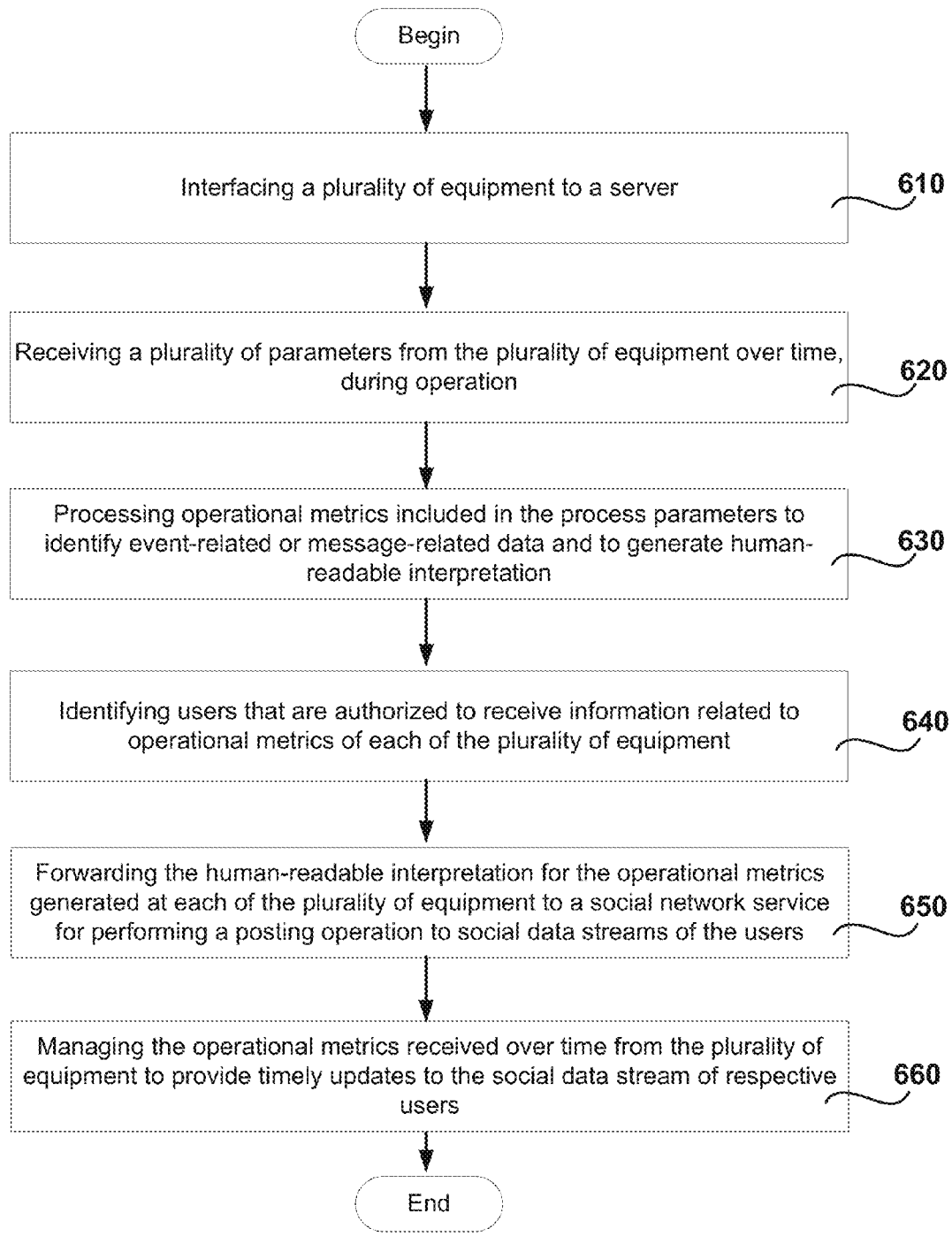
FIG. 6 illustrates process flow operations of a method followed for sharing information related to semiconductor manufacturing equipment operation, in one embodiment of the disclosure.

FIG. 6 illustrates an example flow of operations for a method operated on a server that allows sharing of information related to operation of different equipment used in manufacturing semiconductor wafers, in one embodiment. The process begins at operation 610, wherein plurality of equipment is interfaced with the server. The server may be part of a local area network, a wide area network, the Internet, a cloud network, a private network, etc. The interfacing may use a standard protocol or proprietary equipment interface protocol. The interfacing enables receiving a plurality of process parameters including operational metrics associated with operation of each of the plurality of equipment. As illustrated in operation 620, the server receives a plurality of parameters from the equipment, during operation of the equipment. The operational metrics included in the process parameters of each equipment are processed to identify event-related data or message-related data and to generate human-readable interpretation for the same, as illustrated in operation 630.

Users authorized to receive information related to the operational metrics generated by each of the plurality of equipment, is determined, as illustrated in operation 640. The human-readable interpretation for the operational metrics of each equipment is forwarded to a social network service, as illustrated in operation 650. The human-readable interpretation is used to perform a posting operation to social data streams associated with the identified one or more users. The operational metrics from the plurality of equipment received over time are managed so as to provide timely updates to the respective users, as illustrated in operation 660. The timely updates are provided as additional postings in the corresponding social data streams of the users. Information provided in the postings and/or additional postings may be used by the users to interact with one another to request and receive information that can be used to resolve any issues identified in the postings.

Figure 7:
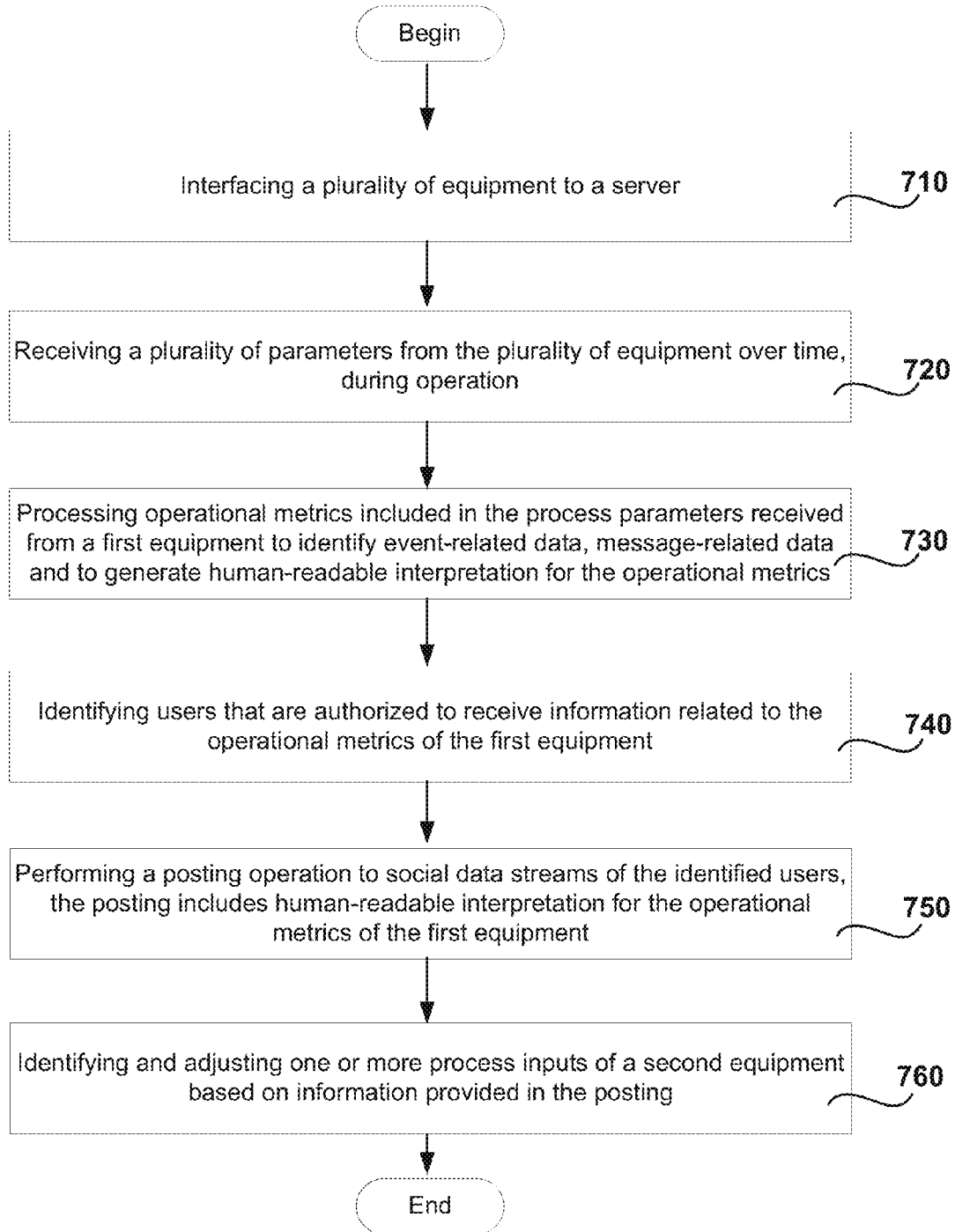
FIG. 7 illustrates process flow operations of a method followed for sharing information related to semiconductor manufacturing equipment operation, in an alternate embodiment of the disclosure.

FIG. 7 illustrates an example flow of operations for a method operated on a server that is used for sharing information related to operation of different equipment used in manufacturing semiconductor wafers, in an alternate embodiment. The process begins at operation 710, wherein the server is interfaced with a plurality of equipment to allow process parameters associated with operation of each of a plurality of equipment interfaced with a server to be received. The server may be part of a network in which the equipment and users are interfaced with the server. The plurality of parameters includes operational metrics generated at each of the plurality of equipment during processing of the semiconductor wafers. During operation, a plurality of process parameters including operational metrics generated at the plurality of equipment are received, as illustrated in operation 720. The process parameters of first equipment are processed to identify event-related data, message-related data contained within and to obtain human-readable interpretation, as illustrated in operation 730.

Users authorized to receive information related to the operational metrics of the first equipment are identified, as illustrated in operation 740. A posting operation is performed to social data streams associated with the identified users, wherein the posting includes the human-readable interpretation, and, in some embodiments, corresponding event-related data, message-related data related to the operational metrics of the first equipment, as illustrated in operation 750. Based on information of the first equipment provided in the posting, one or more process inputs for a second equipment may be identified and adjusted, as illustrated in operation 760. The adjustment of the process inputs of the second equipment are used influence the processing of the semiconductor wafers using the second equipment.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A system, comprising:
   a server that is configured to be interconnected with a plurality of equipment used for manufacturing semiconductor wafers, the server includes,
   an interface to communicatively connect each of the plurality of equipment with the server, the interface configured to allow receiving, at the server, a plurality of parameters that are associated with operation of each of the plurality of equipment, wherein the plurality of parameters include operational metrics generated at the equipment during processing of the semiconductor wafers;

an interpreter module executing on the server configured to receive, process the plurality of parameters, the interpreter module includes, a semantic identifier logic to examine at least a portion of the plurality of parameters of a specific equipment to identify event-related data, message-related data contained within and to identify a human-readable interpretation for the event-related data, message-related data identified in the portion;

a message assembly logic to assemble the human-readable interpretation, message-related data, event-related data for the specific equipment into post data; and a social network service coupled to the interpreter module, the coupling allows the interpreter module to forward the post data to the social network service, the social network service is configured to perform a posting operation of the human-readable interpretation to social data streams associated with one or more users that are authorized to receive information related to the operational metrics of the specific equipment.

2. The system of claim 1, wherein the interface is a web server interface, a proprietary interface, a non-proprietary interface or combinations thereof.

3. The system of claim 1, wherein the interpreter module further includes an event processor that is configured to, obtain event-related data from the semantic identifier logic;

examine the event-related data to identify a trigger event contained within; and associate tags related to the trigger event, wherein the tags are obtained from an events library that maintains information related to a plurality of pre-defined trigger events associated with the plurality of equipment.

4. The system of claim 1, wherein the semantic identifier logic is configured to, examine a portion of string provided in the plurality of parameters associated with a specific equipment to identify a pattern that relates to a keyword, a phrase, a trigger event, or a code contained therein; and provide the portion of string with an identifier of the keyword, the phrase, the trigger event or the code contained therein to the message assembly logic, wherein the message assembly logic is configured to interact with a message library to identify the human-readable interpretation for the identifier provided by the semantic identifier logic, wherein the message library stores a mapping of the identifier to the corresponding human-readable interpretation for various strings of the plurality of parameters that identify patterns related to keywords, phrases, trigger events, and codes that are encountered during processing of the semiconductor wafers.

5. The system of claim 1, wherein the social network service includes, a post data manager to store the post data generated by the message assembly logic into a data store; and a stream serving module to retrieve the post data from the data store related to each equipment for a user authorized to receive the post data, the post data retrieved from the data store is formatted for rendering in accordance to preferences of the user.

6. A method operated on a server that is configured to be interconnected with a plurality of equipment used for manufacturing semiconductor wafers, the method comprising:

interfacing each of the plurality of equipment with the server, the interfacing configured to allow receiving of a plurality of parameters related to operation of each of the plurality of equipment at the server, wherein the plurality of parameters include operational metrics generated at each of the plurality of equipment during processing of the semiconductor wafers;

during operation, receiving the plurality of parameters from the plurality of equipment over a period of time;

processing the operational metrics included in the plurality of parameters for each of the plurality of equipment to identify event-related data or message-related data and to generate human-readable interpretation for the event-related data or message-related data provided in the operational metrics;

determining one or more users that are authorized to receive information related to the operational metrics associated with each of the plurality of equipment;

forwarding the event-related data, message-related data and corresponding human-readable interpretation for the operational metrics generated at each of the plurality of equipment to a social network service for performing a posting operation to social data streams of the respective one or more users; and managing the operational metrics received over time from each of the plurality of equipment so as to provide timely updates to the respective one or more users, the timely updates being provided as additional postings to the social data streams of the one or more users.

7. The method of claim 6, wherein the interfacing is a proprietary interface, a non-proprietary interface, a web server interface or combinations thereof.

8. The method of claim 6, wherein processing the operational metrics further includes associating one or more tags, the tags used to identify any one of an equipment, a user, a notification type, a severity level, a process status, or combinations thereof.

9. The method of claim 8, further includes storing the human-readable interpretation for the operational metrics received from the plurality of equipment and the associated one or more tags in a data store, the stored human-readable interpretation and the associated tags retrieved and assembled for presenting in the social data stream of a user, in response to a request from the user.

10. The method of claim 6, wherein processing the operational metrics further includes, analyzing the event-related data contained within the operational metrics associated with a specific equipment received over the period of time; and generating a notification to the one or more users based on the analysis of the event-related data, the notification including at least a notification type and a severity level of an event identified in the event-related data.

11. The method of claim 10, wherein the notification type is defined based on the severity level of the event identified in the event-related data, the notification type is one of a posting, a phone call, an email, a message alert or any combinations thereof.

12. The method of claim 6, further includes, determining interest level of the one or more users for each of the plurality of equipment, the interest level used to promote the corresponding postings in the social data streams of the one or more users, wherein the interest level of each user is defined by attributes of the user, number and type of interactions initiated by the user over time for the postings related to specific one or more of the plurality of equipment.

13. The method of claim 6, further includes,
determining user preferences of the one or more users for each of the plurality of equipment; and
posting human-readable interpretation for the operational metrics of corresponding equipment to the social data streams of the one or more user in accordance to the respective user preferences.

14. The method of claim 6, wherein the social data streams provided by the social network service includes options to allow the one or more users to interact with one another to share information related the operational metrics of specific one of the plurality of equipment presented in the social data streams.

15. The method of claim 14, wherein providing options further includes,
providing a chat interface within the social data streams to enable sharing of information related to the operational metrics of the specific equipment with other users.

16. A method operated on a server that is configured to be interconnected with a plurality of equipment used for manufacturing semiconductor wafers, the method comprising:
interfacing each of the plurality of equipment with the server, the interfacing configured to allow receiving of a plurality of parameters related to operation of each of the plurality of equipment at the server, wherein the plurality of parameters include operational metrics generated at each of the plurality of equipment during processing of the semiconductor wafers;
during operation, receiving the plurality of parameters from a first equipment over a period of time;
processing the operational metrics included in the plurality of parameters to identify event-related data or message-related data contained within and to generate human-readable interpretation for the event-related data or message-related data provided in the operational metrics of the first equipment;
determining one or more users that are authorized to receive information related to the operational metrics associated with the first equipment;
performing a posting operation to social data streams of the one or more users, wherein the posting operation causes postings of the event-related data, the message-related data and the corresponding human-readable interpretation of the first equipment to the social data streams of the one or more users; and
using information provided in the postings to identify and adjust one or more process inputs of a second equipment, wherein the second equipment is used to perform a subsequent process operation on the semiconductor wafers.

17. A method operated on a server that is configured to be interconnected with a plurality of equipment used in a manufacturing process, the method comprising:
interfacing each of the plurality of equipment with the server, the interfacing configured to allow receiving of a plurality of parameters related to operation of each of the plurality of equipment at the server, wherein the plurality of parameters include operational metrics generated at each of the plurality of equipment during the manufacturing process;
during operation, receiving the plurality of parameters from the plurality of equipment over a period of time;
processing the operational metrics included in the plurality of parameters for each of the plurality of equipment to identify event-related data or message-related data and to generate human-readable interpretation for the event-related data or message-related data provided in the operational metrics;
determining one or more users that are authorized to receive information related to the operational metrics associated with each of the plurality of equipment;
forwarding the event-related data, message-related data and corresponding human-readable interpretation for the operational metrics generated at each of the plurality of equipment to a social network service for performing a posting operation to social data streams of the respective one or more users; and
managing the operational metrics received over time from each of the plurality of equipment so as to provide timely updates to the respective one or more users, the timely updates being provided as additional postings to the social data streams of the one or more users.

* * * * *